(12) United States Patent
Son et al.

(10) Patent No.: US 7,800,961 B2
(45) Date of Patent: Sep. 21, 2010

(54) WORD LINE DRIVER AND SEMICONDUCTOR MEMORY DEVICE HAVING THE SAME

(75) Inventors: Chris Ji Yoon Son, Seoul (KR); Hi-Choon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 12/260,206

(22) Filed: Oct. 29, 2008

(65) Prior Publication Data
US 2009/0116305 A1    May 7, 2009

(30) Foreign Application Priority Data
Oct. 29, 2007    (KR)    ............... 10-2007-0108887

(51) Int. Cl.
*G11C 16/04*    (2006.01)
(52) U.S. Cl. .................. 365/189.09; 365/230.06; 365/226; 365/189.11
(58) Field of Classification Search ............ 365/189.09, 365/230.06, 226, 189.11, 194
See application file for complete search history.

(56) References Cited

U.S. PATENT DOCUMENTS 7,359,254 B2 *    4/2008    Takeda ............... 365/189.09

FOREIGN PATENT DOCUMENTS

| JP | 07-296581 | 11/1995 |
|---|---|---|
| KR | 1020010064524 A | 7/2001 |
| KR | 1020030026035 A | 3/2003 |

* cited by examiner

*Primary Examiner*—David Lam
(74) *Attorney, Agent, or Firm*—Volentine & Whitt, P.L.L.C.

(57) ABSTRACT

A word line driver for use in a semiconductor memory device includes a boosted voltage generator, a sub word line driver and a main word line driver. The boosted voltage generator generates a boosted voltage by receiving an internal power supply voltage and pumping electric charge. The sub word line driver receives the internal power supply voltage and activates a boosted voltage control signal after supplying the internal power supply voltage to a boost node in a command operating mode. The main word line driver enables a word line by supplying the boosted voltage to the boost node in response to the boosted voltage control signal in a normal operating mode, and enables the word line with the boosted voltage after boosting the word line to the internal power supply voltage by changing the boost node from the internal power supply voltage to the boosted voltage in the command operating mode.

20 Claims, 5 Drawing Sheets

FIG. 5

WORD LINE DRIVER AND SEMICONDUCTOR MEMORY DEVICE HAVING THE SAME

CROSS-REFERENCE TO RELATED APPLICATION

A claim of priority is made to Korean Patent Application No. 10-2007-0108887, filed Oct. 29, 2007, in the Korean Intellectual Property Office, the subject matter of which is hereby incorporated by reference.

BACKGROUND

1. Field of the Invention

The present invention relates to a semiconductor memory device, and more particularly, to a word line driver and a semiconductor memory device having the same for boosting an internal power supply voltage to a boosted voltage.

2. Description of the Related Art

In general, memory cells within a semiconductor memory device include an n-type metal-oxide-semiconductor (NMOS) transistor. Since the transistor has a leakage current component, the semiconductor memory device should periodically repeat a data recovery operation before data stored in a memory cell is erased due to the leakage current.

The data recovery operation is called a refresh operation and is performed in memory cells capable of being selected by dividing internal addresses in the semiconductor memory device. When an internal address is sequentially incremented, the data recovery operation is called a self-refresh operation.

When the address is sequentially incremented in the self-refresh operation, a word line connected to a gate terminal of an NMOS transistor within a memory cell is enabled, and hence data of the memory cell is recovered.

At this time, the NMOS transistor is turned on when a gate voltage is a threshold voltage Vt higher than a source voltage. Since a maximum voltage applied to the semiconductor memory device is an external power supply voltage VDD, a transferred voltage has a value (VDD−Vt) by threshold voltage drop.

In order to offset the effect of threshold voltage drop, the voltage of the word line uses a boosted voltage VPP (for example, 3.0 V) generated by boosting an internal power supply voltage VINT (for example, 1.5 V).

Since the boosted voltage VPP can compensate for threshold voltage loss, it is widely used in a dynamic random access memory (DRAM) circuit. A memory cell transistor has a minimum size among transistors configuring a chip. Since the memory cell transistor is a threshold voltage higher than other transistors, the amplitude of the boosted voltage VPP should be equal to or greater than a value (VDD+Vt) in a word line driver circuit.

However, in the boosted voltage generator for boosting the internal power supply voltage VINT to the boosted voltage VPP, there is a predetermined amount of current component consumed due to limited efficiency of the boosted voltage generator itself in a conventional charge pumping process.

Figure 1:
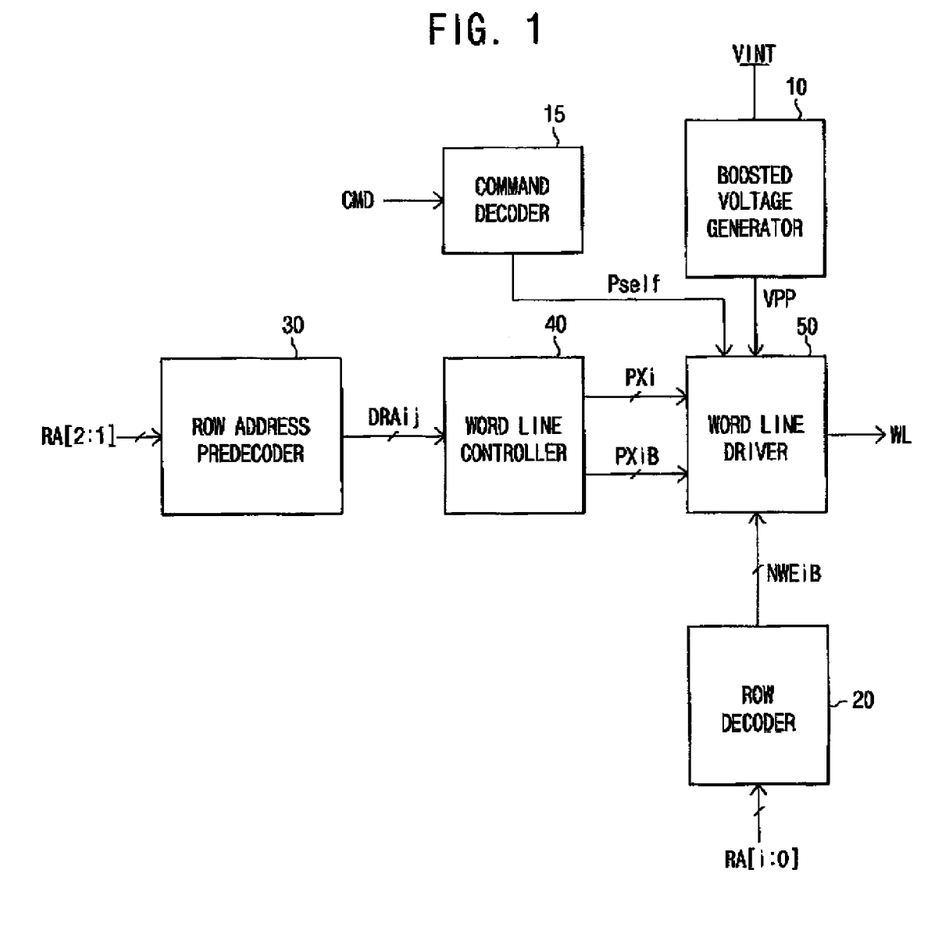
FIG. 1 is a partial block diagram showing an operation in which a word line of a semiconductor memory device is enabled.

FIG. 1 is a block diagram of a portion of a semiconductor memory device showing an operation in which a word line of the semiconductor memory device is enabled. The semiconductor memory device includes a boosted voltage generator 10, a command decoder 15, a row decoder 20, a row address predecoder 30, a word line controller 40, and a conventional word line driver 50. Functions of blocks will be described with reference to FIG. 1.

The boosted voltage generator 10 generates a boosted voltage VPP by receiving an internal power supply voltage VINT and pumping electric charge until a predetermined target voltage is reached. The command decoder 15 generates an internal command signal Pself by receiving and decoding an external command CMD. The row decoder 20 generates a word line enable bar signal NWEiB for activating corresponding word lines in response to row address signals RA [i:0] of predetermined bits.

The row address predecoder 30 generates multiple decoded row address signals DRAij to be selectively enabled according to activation of the semiconductor memory device in response to address signals RA [2:1] of other bits except the predetermined bits. The word line controller 40 receives a decoded row address signal DRAij and generates word line enable control signals PXi and PXiB for controlling a word line WL to be enabled or disabled. The word line driver 50 receives the boosted voltage VPP from the boosted voltage generator 10 and enables the word line WL in response to the word line enable bar signal NWEiB and the word line enable control signals PXi and PXiB.

Figure 2:
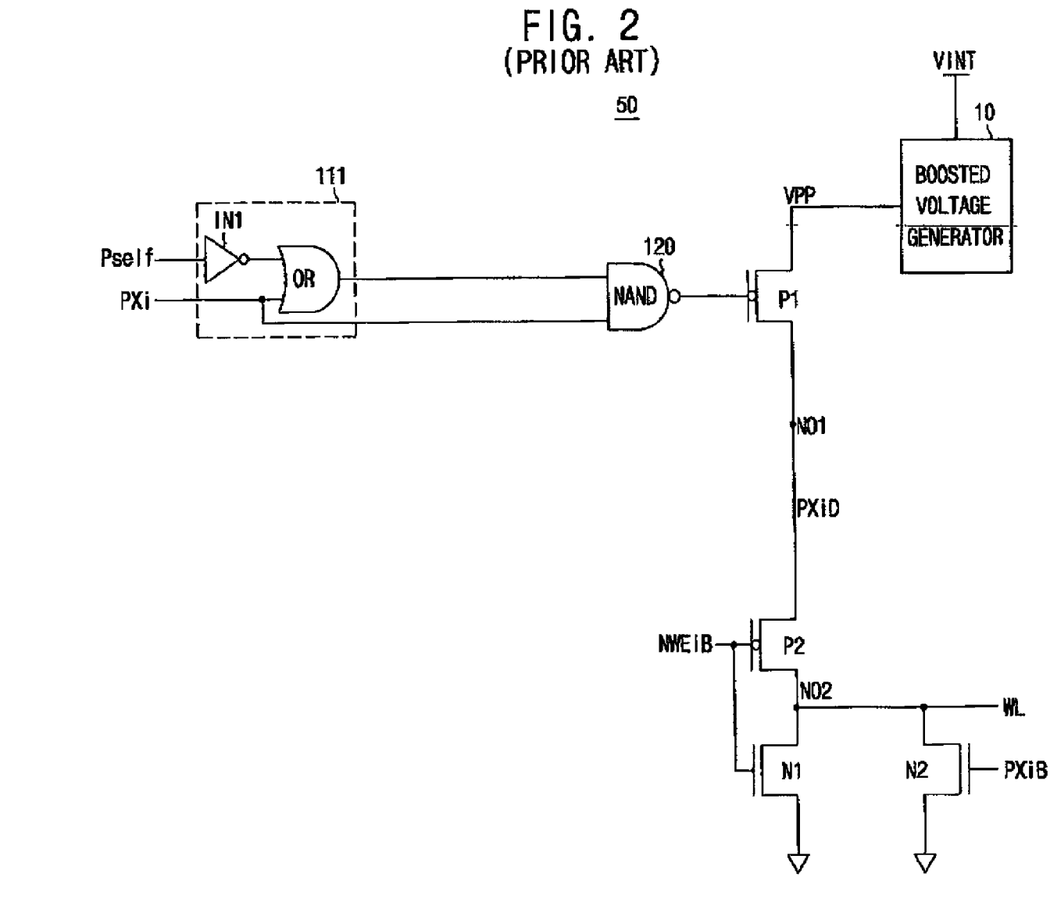
FIG. 2 is a circuit diagram of a conventional word line driver within the semiconductor memory device shown in FIG. 1.

FIG. 2 is a circuit diagram of a conventional word line driver of the semiconductor memory device shown in FIG. 1, which includes two p-type metal-oxide-semiconductor (PMOS) transistors P1 and P2, two NMOS transistors N1 and N2, an operating mode selector 111, configured with an inverter IN1 and an OR gate, and a boosted voltage controller 120, configured with a NAND gate.

The first PMOS transistor P1 receives the boosted voltage VPP from the boosted voltage generator 10 through a source terminal, and transfers the boosted voltage VPP to a boost node NO1 in response to an inverted signal of the word line enable control signal PXi, which is a first control signal, applied to a gate terminal. The second PMOS transistor P2 receives the boosted voltage VPP from the first PMOS transistor P1 through a source terminal and enables a corresponding word line WL connected to an enable node N02 with the boosted voltage VPP in response to the word line enable bar signal NWEiB applied to a gate terminal.

The first NMOS transistor N1 and second NMOS transistor N2 each receives a ground voltage through a source terminal. NMOS transistor N1 transfers the ground voltage to the enable node NO2 in response to the word line enable bar signal NWEiB applied to a gate terminal, and NMOS transistor N2 disables the corresponding word line WL connected to the enable node N02 with the ground voltage in response to the word line enable control signal PXiB, which is a second control signal, applied to a gate terminal.

Figure 3:
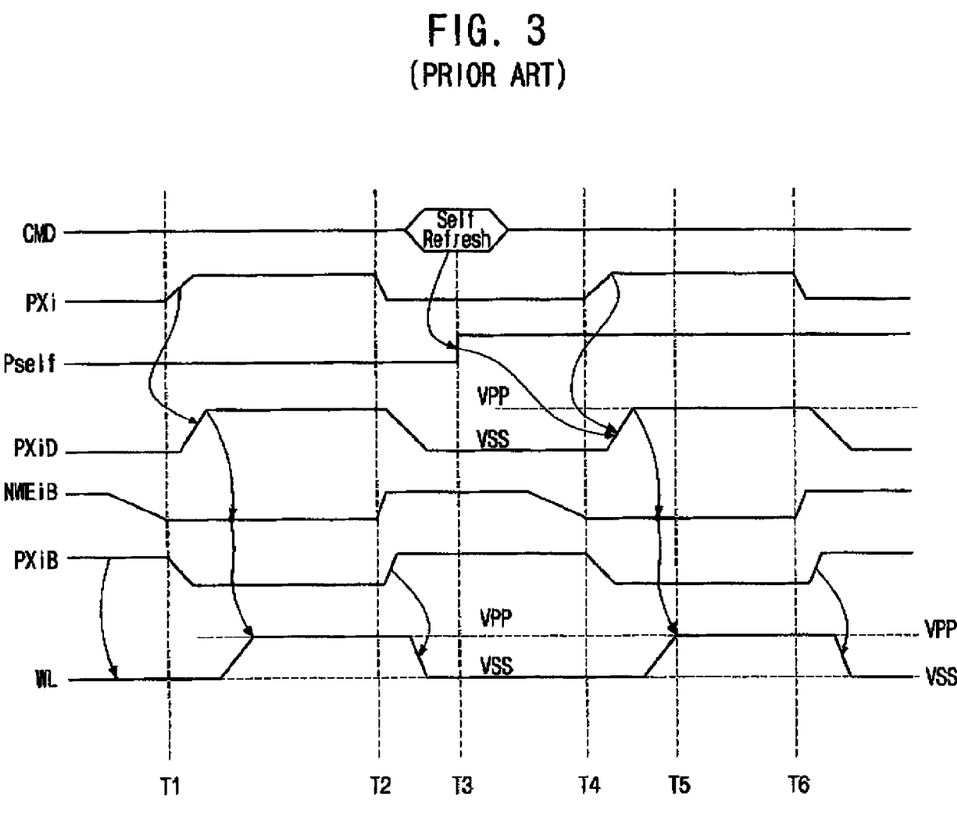
FIG. 3 is a timing diagram showing an operation in which a word line of the semiconductor memory device shown in FIG. 2 is enabled.

FIG. 3 is a timing diagram showing an operation of the conventional word line driver shown in FIG. 2, in which a word line is enabled. The operation includes the external command CMD, the word line enable control signal PXi, the internal command signal Pself, a boost node voltage signal PXiD, the word line enable bar signal NWEiB, the word line enable control signal PXiB, and a word line signal WL.

The external command CMD is used to load an external self-refresh command for periodically recovering data stored in memory cells, while sequentially incrementing an internal address. The external command CMD is shown as only the self-refresh command for convenience of explanation, although the external command CMD may be a command for performing a command operation other than a normal operation for performing a data read, a data write, an active operation, or the like of the semiconductor memory device.

When the row address predecoder 30 activates a corresponding word line WL while the word line enable control signal PXi is initially maintained at a low level, the word line enable control signal PXi transits to a high level at times T1 and T4. When other word lines are activated, the word line enable control signal PXi re-transits to the low level at times T2 and T6.

The self-refresh command is loaded to the external command CMD. The internal command signal Pself is initially maintained at the low level and then the internal command signal Pself transits to the high level at time T3.

The word line enable control signal PXi transits to the high level at times T1 and T4, and transits to the low level at times T2 and T6, while the boost node voltage signal PXiD is initially maintained at the low level. The boost node voltage signal PXiD then transits to the boosted voltage VPP and the ground voltage VSS, respectively.

After a corresponding word line WL is disabled while the word line enable bar signal NWviB is initially maintained at the high level, the word line enable bar signal NWEiB transits to the low level at times T1 and T4 when the row decoder 20 activates the corresponding word line WL, such that the corresponding word line WL is enabled.

After the corresponding word line WL is disabled to the ground voltage while the word line enable control signal PXiB is initially maintained at the high level, the word line enable control signal PXiB transits to the low level at times T1 and T4 when the row address predecoder 30 activates the corresponding word line WL. When other word lines are activated, the word line enable control signal PXiB re-transits to the high level at times T2 and T6 and the corresponding word line WL is disabled to the ground voltage.

When the row decoder 20 activates the corresponding word line WL and the word line enable bar signal NWEiB transits to the low level at times T1 and T4 while the word line signal WL is initially maintained at the ground voltage VSS in response to the word line enable control signal PXiB, the boost node voltage signal PXiD is delayed for a given time and transferred. When other word lines are activated and the word line enable bar signal NWEiB transits to the high level at times T2 and T6, the word line signal WL is dropped to the ground voltage VSS in response to the word line enable control signal PXiB.

An illustrative operation in which a word line of the word line driver 50 is conventionally enabled will be described with reference to FIGS. 1 to 3.

Before a corresponding word line WL is activated at an initial time, the corresponding word line WL is deactivated when the corresponding word line enable bar signal NWEiB is deactivated to the high level and the corresponding word line enable control signals PXi and PXiB are deactivated to the low level and the high level, respectively. Accordingly, the corresponding word line enable control signal PXi at the low level is inverted to the high level by the NAND gate and is applied to the gate terminal of the first PMOS transistor P1. Then, the first PMOS transistor P1 is turned off and the supply of the boosted voltage VPP is interrupted. The second NMOS transistor N2 is turned on, the ground voltage is transferred to the enable node N02, and the corresponding word line WL is maintained at the ground voltage VSS.

First, an operation in which a word line of the semiconductor memory device is conventionally enabled in a normal operating mode will be described.

When a corresponding word line WL is activated in response to a corresponding row address signal among multiple row address signals in the row decoder 20, a corresponding word line enable bar signal NWEiB is activated to the low level at time T1 and corresponding word line enable control signals PXi and PXiB are activated to the high level and the low level, respectively.

When the corresponding row address signal is activated in the row decoder 20 and the internal command signal Pself indicating a self-refresh operation is applied at the low level, the internal command signal Pself is inverted to the high level by the inverter IN1 and is applied to an OR gate 121 along with the corresponding word line enable control signal PXi activated to the high level. The OR gate 121 outputs a high-level signal by performing an OR operation.

The NAND gate outputs a low-level signal by performing a NAND operation on the high-level signal output from the OR gate and the corresponding word line enable control signal PXi activated to the high level. The low-level signal is applied to the gate terminal of the first PMOS transistor P1. Accordingly, when the first PMOS transistor P1 is turned on, the boosted voltage VPP is transferred to the boost node NO1, and when the corresponding word line enable bar signal NWEiB is activated to the low level at time T1, the second PMOS transistor P2 is turned on, and the boosted voltage VPP is transferred to the enable node N02, such that the corresponding word line WL is enabled to the boosted voltage VPP.

Then, when other word lines are activated among multiple row address signals in the row decoder 20, the corresponding word line enable bar signal NWEiB is deactivated to the high level at time T2. The corresponding word line enable control signals PXi and PXiB are deactivated to the low level and the high level, respectively.

Accordingly, the corresponding word line enable control signal PXi at the low level is inverted to the high level by the NAND gate, and is applied to the gate terminal of the first PMOS transistor P1. Simultaneously, the corresponding word line enable control signal PXiB at the high level is applied to the gate terminal of the second NMOS transistor N2. At this time, the first PMOS transistor P1 is turned off to stop the transfer of the boosted voltage VPP to the boost node NO1, and the second NMOS transistor N2 is turned on to transfer the ground voltage to the corresponding word line WL, such that the word line WL is disabled.

Next, an operation in which a word line of the semiconductor memory device is conventionally enabled in the self-refresh operating mode will be described.

When a corresponding row address signal is activated in the row decoder 20 and the internal command signal Pself indicating the self-refresh operation is applied at the high level, the internal command signal Pself is inverted to the low level by the inverter IN1 and is applied to the OR gate, along with the corresponding word line enable control signal PXi activated to the high level. The OR gate outputs a high-level signal by performing an OR operation.

The NAND gate outputs a low-level signal by performing a NAND operation on the high-level signal output by the OR operation and the corresponding word line enable control signal PXi activated to the high level. The low-level signal of the NAND gate is applied to the gate terminal of the first PMOS transistor P1.

Accordingly, when the first PMOS transistor P1 is turned on, the boosted voltage VPP is transferred to the boost node NO1, and the corresponding word line enable bar signal NWEiB is activated to the low level at time T4. The second PMOS transistor P2 is turned on and the boosted voltage VPP is transferred to the enable node N02, such that the corresponding word line WL is enabled to the boosted voltage VPP.

Then, when other word lines are activated among multiple row address signals in the row decoder 20, the corresponding word line enable bar signal NWEiB is deactivated to the high level at time T6. The corresponding word line enable control signals PXi and PXiB are deactivated to the low level and the high level, respectively.

Accordingly, the corresponding word line enable control signal PXiB at the high level is applied to the gate terminal of the second NMOS transistor N2. The second NMOS transistor N2 is turned on and the ground voltage is transferred to the corresponding word line WL, such that the corresponding word line WL is disabled.

In the conventional word line driver 50 of the semiconductor memory device, the corresponding word line WL is enabled and corresponding memory cell data coupled to the word line are recovered. In the case of both the normal operating mode and the self-refresh operating mode, the voltage of the enabled word line WL becomes the boosted voltage VPP.

At this time, a fixed amount of boosted voltage charge is additionally consumed due to limited efficiency of the boosted voltage generator 10 within the semiconductor memory device. That is, the boosted voltage generator 10 receives the internal power supply voltage VINT and the boosted voltage charge is supplied through the charge pumping process. The boosted voltage generator 10 may have a predetermined efficiency limit since the boosted voltage VPP of 100% is not generated while consuming the entire internal power supply VINT.

For example, an internal power supply current of about 30 mA is consumed to supply a boosted current of 10 mA. In this case, the boosted voltage generator 10 has an efficiency of about 33% (=(10 mA/30 mA)*100). Accordingly, although the internal power supply current to be actually consumed is only 10 mA, an additional internal power supply current of 20 mA is inefficiently consumed to generate the boosted current of 10 mA.

SUMMARY

Embodiments of the present invention provide a semiconductor memory device having a word line driver that provides a boosted voltage by sequentially supplying an internal power supply voltage and the boosted voltage to the word line.

According to an aspect of the present invention, a word line driver for use in a semiconductor memory device includes a boosted voltage generator, a sub word line driver and a main word line driver. The boosted voltage generator generates a boosted voltage by receiving an internal power supply voltage and pumping electric charge. The sub word line driver receives the internal power supply voltage, activates a boosted voltage control signal in a normal operating mode in response to a command signal, and activates the boosted voltage control signal after supplying the internal power supply voltage to a boost node in a command operating mode. The main word line driver enables a word line with the boosted voltage by supplying the boosted voltage to the boost node in response to the boosted voltage control signal in the normal operating mode, and enables the word line with the boosted voltage after boosting the word line to the internal power supply voltage by changing the boost node from the internal power supply voltage to the boosted voltage, in the command operating mode.

The main word line driver may include a boosted voltage supply and a word line enable unit. The boosted voltage supply receives and transfers the boosted voltage to the boost node in response to the boosted voltage control signal. The word line enable unit enables the word line with the boosted voltage by receiving the boosted voltage from the boosted voltage supply in the normal operating mode in response to the command signal, and enables the word line with the boosted voltage by receiving the boosted voltage from the boosted voltage supply after initially boosting the word line to the internal power supply voltage by receiving the internal power supply voltage from the sub word line driver in the command operating mode.

The word line enable unit may enable or disable the word line with the boosted voltage or with a ground voltage, respectively, in the normal operating mode in response to a word line enable bar signal and a second word line enable control signal. The word line enable unit may enable or disable the word line with the boosted voltage, after boosting the word line to the internal power supply voltage, or with the ground voltage, respectively, in the command operating mode.

The boosted voltage supply may include a first p-type metal-oxide-semiconductor (PMOS) transistor that receives and transfers the boosted voltage to the boost node in response to the boosted voltage control signal.

The word line enable unit may include a second PMOS transistor that receives the boosted voltage from the first PMOS transistor at one side and transfers the boosted voltage to the word line connected to an enable node in response to the word line enable bar signal; a first n-type metal-oxide-semiconductor (NMOS) transistor that receives and transfers the ground voltage to the word line in response to the word line enable bar signal; and a second NMOS transistor that receives and transfers the ground voltage to the word line in response to the second word line enable control signal when other word lines are activated.

The sub word line driver may include an operating mode selector, an internal power supply, a delay unit and a boosted voltage controller. The operating mode selector outputs an operating mode selection signal for selecting the normal operating mode or the command operating mode according to a voltage of the command signal. The internal power supply receives and transfers the internal power supply voltage before the boosted voltage is transferred in response to a first word line enable control signal and the command signal. The delay unit receives the operating mode selection signal and outputs a delay signal for delaying the boosted voltage to be supplied by the boosted voltage supply until the internal power supply voltage is transferred. The boosted voltage controller outputs the boosted voltage control signal for controlling whether to transfer the boosted voltage by receiving the delay signal and the first word line enable control signal and performing a NAND operation thereon.

The operating mode selector may include a first inverter that receives and inverts the command signal and outputs the inverted command signal; and a NOR gate that outputs the operating mode selection signal by receiving the inverted command signal and the first word line enable control signal and performing a NOR operation thereon.

The internal power supply may include a second NAND gate, second inverter, a third PMOS transistor and third NMOS transistor. The second NAND gate outputs an internal power supply voltage control signal for preventing the boosted voltage and the internal power supply voltage from being simultaneously supplied by receiving the boosted voltage control signal, the first word line enable control signal, and the command signal, and performing a NAND operation thereon. The second inverter receives and inverts the first word line enable control signal and outputs the inverted word line enable control signal. The third PMOS transistor that receives and transfers the internal power supply voltage to the boost node in response to the internal power supply voltage control signal. The third NMOS transistor receives and transfers the ground voltage to the boost node in response to the inverted first word line enable control signal.

The delay unit may include an odd number of inverters that receive the operating mode selection signal and output the delay signal by inverting a level after a time delay until the internal power supply voltage is transferred.

The boosted voltage controller may include a first NAND gate that outputs the boosted voltage control signal by receiving the delay signal and the first word line enable control signal and performing a NAND operation thereon.

At least one of a data read, a data write, and an active operation may be performed in the normal operating mode, and a self-refresh operation may be performed in the command operating mode.

According to an another aspect of the present invention, a semiconductor memory device includes a boosted voltage generator that generates a boosted voltage by receiving an internal power supply voltage and pumping electric charge, a command decoder that receives and decodes an external command and generates a command signal, a row decoder that generates at least one word line enable bar signal for activating corresponding word lines by receiving and decoding row address signals of predetermined bits, a row address predecoder that generates decoded row address signals by receiving and decoding row address signals of other bits except the predetermined bits, and a word line controller that receives a decoded row address signal from the row address predecoder and generates first and second word line enable control signals for controlling a word line. The semiconductor memory device also includes a word line driver that enables the word line by activating a boosted voltage control signal in a normal operating mode in response to the command signal, the word line enable bar signal, and one of the decoded row address signals and supplying the boosted voltage to a boost node, and that enables the word line with the boosted voltage after boosting the word line to an internal power supply voltage by activating the boosted voltage control signal after the internal power supply voltage is supplied to the boost node in a command operating mode.

The word line driver may further include a sub word line driver and a main word line driver. The sub word line driver receives the internal power supply voltage, activates the boosted voltage control signal in the normal operating mode in response to the command signal, and activates the boosted voltage control signal after supplying the internal power supply voltage to the boost node in the command operating mode. The main word line driver enables the word line with the boosted voltage by supplying the boosted voltage to the boost node in response to the boosted voltage control signal in the normal operating mode, and enables the word line with the boosted voltage after boosting the word line to the internal power supply voltage by changing the boost node from the internal power supply voltage to the boosted voltage in the command operating mode.

BRIEF DESCRIPTION OF THE DRAWINGS

The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 4:
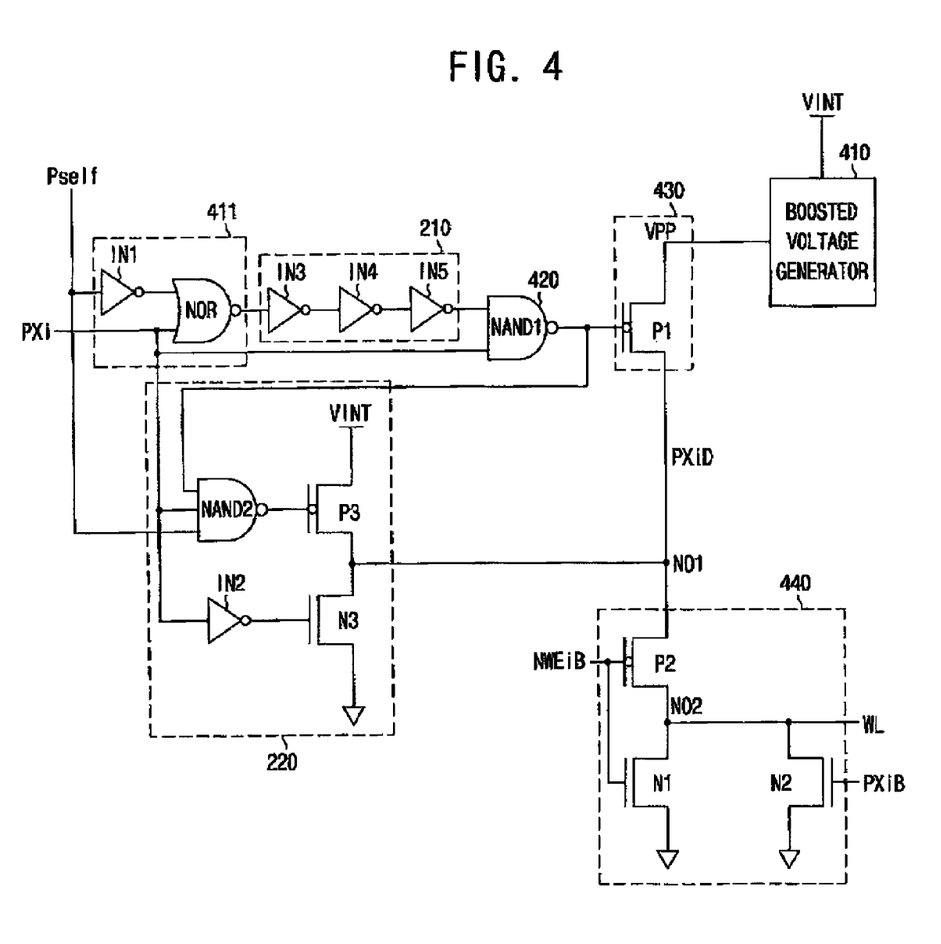
FIG. 4 is a circuit diagram of a word line driver of a semiconductor memory device for driving a word line, according to an exemplary embodiment of the present invention.

FIG. 4 is a circuit diagram of a word line driver of a semiconductor memory device for driving a word line, according to an exemplary embodiment of the present invention. The word line driver includes a boosted voltage generator 410, a main word line driver, and a sub word line driver.

The main word line driver includes a boosted voltage supply 430 configured with a first PMOS transistor P1, and a word line enable unit 440 configured with a second PMOS transistor P2 and first and second NMOS transistors N1 and N2. The sub word line driver includes an operating mode selector 411 configured with a first inverter IN1 and a NOR gate; an internal power supply 220 configured with a second NAND gate NAND2, a second inverter IN2, a third PMOS transistor P3 and a third NMOS transistor N3; a delay unit 210 configured with three inverters IN3 to IN5; and a boosted voltage controller 420 configured with a first NAND gate NAND 1.

Functions of blocks within the semiconductor memory device for driving a word line, according to an exemplary embodiment, will be described with reference to FIG. 4.

The boosted voltage generator 410 generates a boosted voltage VPP by receiving an internal power supply voltage VINT and pumping electric charge until a predetermined target voltage is reached. The operating mode selector 411 outputs an operating mode selection signal for selecting a normal operating mode or a self-refresh operating mode, according to a voltage level of an applied internal self-refresh command signal Pself. The internal power supply 220 receives and initially transfers the internal power supply voltage VINT before the boosted voltage VPP is supplied in response to a word line enable control signal PXi, which is a first control signal, and the internal command signal Pself The delay unit 210 receives the operating mode selection signal (e.g., a NOR operation result of the word line enable control signal PXi and the inverted internal command signal Pself), and outputs a delay signal for delaying the supply of the boosted voltage VPP until the internal power supply 220 transfers the internal power supply voltage VINT for a predetermined time.

In FIG. 4, the three inverters IN3 to IN5 of the delay unit 210 are shown for convenience of explanation. However, any odd number of inverters (e.g., more than three) can be configured to receive the operating mode selection signal and to output the delay signal by inverting a level after a time delay until the internal power supply voltage VINT is transferred.

The boosted voltage controller 420 outputs a boosted voltage control signal for controlling the transfer of the boosted voltage VPP by performing a NAND operation on the operating mode selection signal delayed by the delay unit 210 and the word line enable control signal PXi. The boosted voltage supply 430 receives and transfers the boosted voltage VPP in response to the boosted voltage control signal from the boosted voltage controller 420.

The word line enable unit 440 receives the internal power supply voltage VINT from the internal power supply 220 and receives the boosted voltage VPP from the boosted voltage supply 430. The word line enable unit 440 primarily boosts a corresponding word line WL to a level of the internal power supply voltage VINT and secondarily boosts the corresponding word line WL to a level of the boosted voltage VPP after a predetermined time has elapsed, in response to a word line enable bar signal NWEiB and a word line enable control signal PXiB, which is a second control signal.

Figure 5:
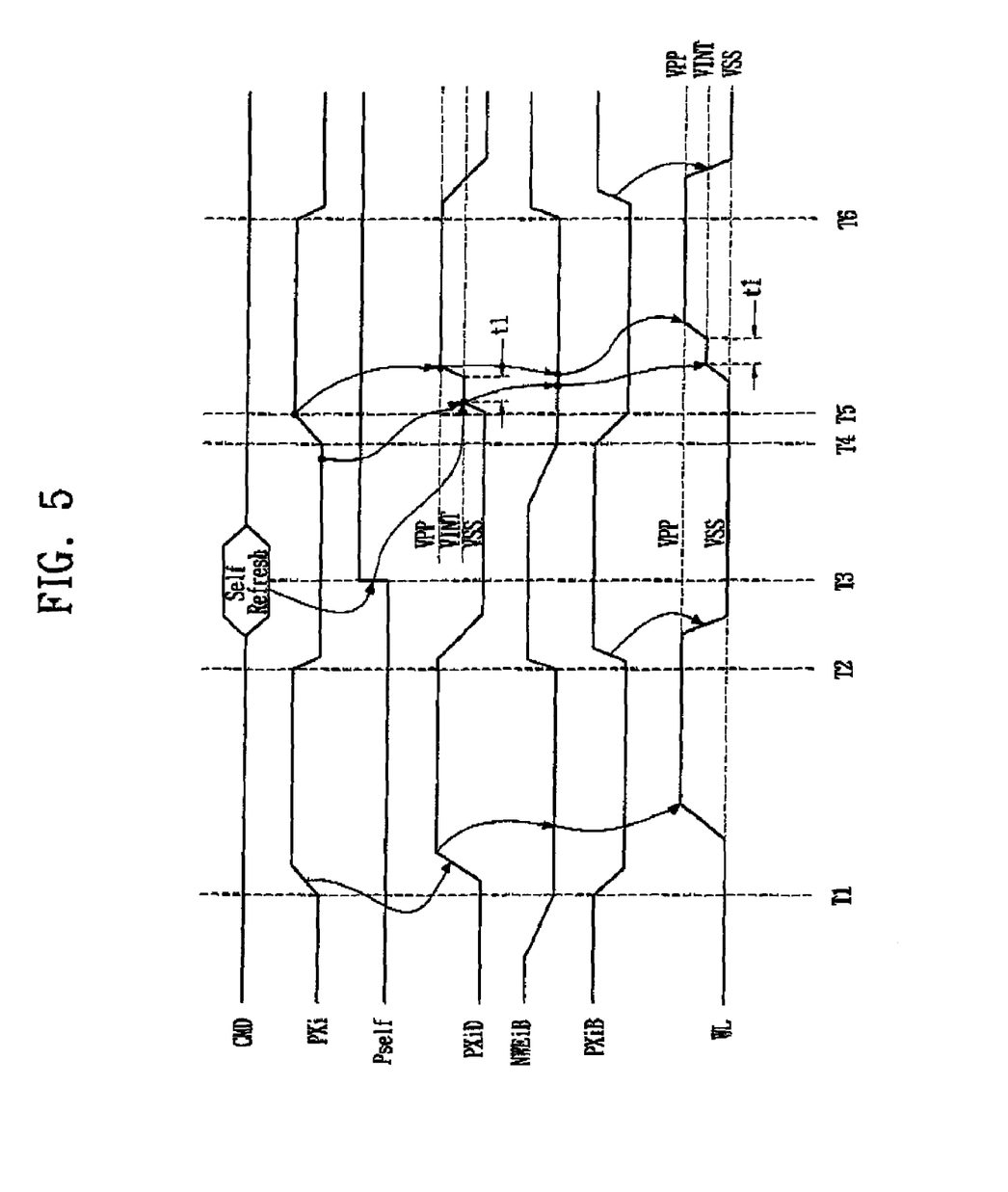
FIG. 5 is a timing diagram showing an operation in which a word line of the semiconductor memory device for driving the word line is enabled, according to an exemplary embodiment of the present invention.

FIG. 5 is a timing diagram showing an operation in which a word line of the semiconductor memory device for driving the word line is enabled, according to an exemplary embodiment of the invention. The operation includes an external command CMD, the word line enable control signal PXi, the internal command signal Pself, a boost node voltage signal PXiD, the word line enable bar signal NWEiB, the word line enable control signal PXiB, and a word line signal WL.

The external command CMD, the word line enable control signal PXi, the internal command signal Pself, the word line enable bar signal NWEiB, and the word line enable control signal PXiB may be substantially the same as described above, which respect to the timing diagram depicted in FIG. 3, and the description will therefore not be repeated. Also, the external command CMD is shown in FIG. 5 as only the self-refresh command for convenience of explanation, although the external command CMD may be a command for performing a command operation other than a normal operation for performing a data read, a data write, an active operation, or the like of the semiconductor memory device.

The word line enable control signal PXi transits to the high level and the low level at times T1 and T2, respectively, in a state in which the internal command signal Pself is at the low level. The boost node voltage signal PXiD is initially maintained at the low level, then transits to the boosted voltage VPP and the ground voltage VSS, respectively, following the times T1 and T2.

Before the word line enable control signal PXi transits to the high level at time T4 in a state in which the internal command signal Pself transits to the high level at time T3, the boost node voltage signal PXiD is primarily boosted to a level of the internal power supply voltage VINT. After a predetermined time t1 elapses and the word line enable control signal PXi transits to the high level at time T4, the boost node voltage signal PXiD is secondarily boosted to the boosted voltage VPP. When the word line enable control signal PXi transits to the low level at time T6, the boost node voltage signal PXiD transits to the ground voltage.

In the depicted embodiment, the predetermined time t1 is a length of delay of the supply of the boosted voltage VPP from the boosted voltage supply 430. The predetermined time t1 is based on when the delay unit 210 of FIG. 4 receives an operating mode selection signal from operating mode selector 411, during which time the internal power supply voltage VINT is transferred from the sub word line driver to the boost node NO 1.

Generally, when a row decoder (e.g., row decoder 20 of FIG. 1) activates a corresponding word line WL, and the word line enable bar signal NWEiB transits to the low level at times T1 and T4 while the word line signal WL is initially maintained at the ground voltage VSS in response to the word line enable control signal PXiB, the boost node voltage signal PXiD is delayed for a given time and transferred. When other word lines are activated, and the word line enable bar signal NWEiB transits to the high level at times T2 and T6, the word line signal WL is dropped back to the ground voltage VSS in response to the word line enable control signal PXiB.

An operation in which a word line of the conventional semiconductor memory device according to an exemplary embodiment of the present invention is enabled will be described with reference to FIGS. 1, 4, and 5.

Before the corresponding word line WL is activated at an initial time, the corresponding word line enable bar signal NWEiB is deactivated to the high level and the corresponding word line enable control signals PXi and PXiB are deactivated to the low level and the high level, respectively. Accordingly, the word line enable control signal PXi at the low level is effectively inverted to the high level by the first NAND gate NAND1. The word line enable control signal PXi is also applied to a first input of the second NAND gate NAND2, and inverted to the high level by the second inverter IN2 and applied to a gate terminal of the third NMOS transistor N3. When the word line enable control signal PXi inverted to the high level by the second inverter IN2 at the initial time is applied to the gate terminal of the third NMOS transistor N3, the third NMOS transistor N3 is turned on and the ground voltage is transferred to the boost node NO1.

When the corresponding word line WL is activated in response to a corresponding row address signal among multiple row address signals (e.g., in the row decoder 20), the corresponding word line enable bar signal NWEiB is activated to the low level at time T1 and the corresponding word line enable control signals PXi and PXiB are activated to the high level and the low level, respectively. When the corresponding word line enable bar signal NWEiB is at the low level at time T1 while the ground voltage is maintained, the low-level signal is applied to a gate terminal of the second PMOS transistor P2 within the main word line driver, and the PMOS transistor P2 is turned on. The ground voltage is transferred to the enable node N02 and the corresponding word line WL is maintained at the ground voltage VSS.

First, an operation in which a word line of the semiconductor memory device is enabled in a normal operating mode will be described.

When a corresponding row address signal is activated (e.g., in the row decoder 20) and the internal command signal Pself indicating the self-refresh operation is applied at the low level, the low-level internal command signal Pself is input to the second NAND gate NAND2 in the internal power supply 220, which performs a NAND operation and outputs a high-level signal. The high-level signal is applied to a gate terminal of the third PMOS transistor P3. Accordingly, the third PMOS transistor P3 is turned off and the internal power supply voltage VINT is not transferred to the boost node NO 1.

The internal command signal Pself at the low level, indicating normal operation, is also inverted to the high level by the inverter IN1 and applied to the NOR gate, along with the word line enable control signal PXi activated to the high level. The NOR gate outputs a low-level signal by performing a NOR operation. The delay unit 210 receives the low-level signal and outputs a high-level delay signal by inverting and delaying the low-level signal for a given time.

The first NAND gate NAND1 outputs a low-level signal by performing a NAND operation on the high-level delay signal and the word line enable control signal PXi activated to the high level. The low-level signal is applied to a gate terminal of the first PMOS transistor P1 of the main word line driver. Accordingly, the first PMOS transistor P1 is turned on and the boosted voltage VPP is transferred to the boost node NO1. When the word line enable bar signal NWEiB is activated to the low level at time T1, the second PMOS transistor P2 is turned on and the boosted voltage VPP is transferred to the enable node NO2, such that the corresponding word line WL is enabled to the boosted voltage VPP.

Then, when other word lines are activated among the multiple row address signals, the corresponding word line enable bar signal NWEiB is deactivated to the high level at time T2, and the corresponding word line enable control signals PXi and PXiB are deactivated to the low level and the high level, respectively. Accordingly, the corresponding word line enable control signal PXi at the low level is inverted to the high level by the first NAND gate NAND1, which applies the high-level signal to the gate terminal of the first PMOS transistor P1 of the main word line driver. The corresponding word line enable control signal PXiB at the high level is applied to the gate terminal of the second NMOS transistor N2 of the main word line driver. In response, the first PMOS transistor P1 is turned off and the transfer of the boosted voltage VPP to the boost node NO1 is stopped, and the second NMOS transistor N2 is turned on and the ground voltage is transferred to the corresponding word line WL, such that the corresponding word line WL is disabled.

Next, an operation in which a word line of the semiconductor memory device is enabled in the self-refresh operating mode, according to an exemplary embodiment of the present invention, will be described.

The self-refresh operation is indicated when a corresponding row address signal is activated and the internal command signal Pself is applied at the high level at time T3. The high-level internal command signal Pself is inverted to the low level by the inverter IN1. The low-level signal is applied to the NOR gate along with the corresponding word line enable control signal PXi still in a deactivated state at the low level. The NOR gate therefore outputs a high-level signal by performing a NOR operation. The delay unit 210 receives the high-level signal and outputs a low-level delay signal, delaying for a time t1.

The first NAND gate NAND1 receives the low-level delay signal from the delay unit 210 and the low-level word line enable control signal PXi, and outputs a high-level signal by performing a NAND operation. Therefore, the first PMOS transistor P1 of the main word line driver is still turned off, and the boosted voltage VPP can be prevented from being transferred to the boost node NO1. Simultaneously, the high-level signal output from the first NAND gate NAND1 is applied to a first input terminal of the second NAND gate NAND2 within the internal power supply 220.

At time T4, the word line enable control signal PXi is activated to the high level and input to the NOR gate, the first NAND gate NAND1 and the second NAND gate NAND2. Accordingly, the NOR gate outputs a low-level signal, which is inverted to a high-level signal and delayed by time t1 by the delay unit 210. During the delay, the output of the first NAND gate NAND1 remains at the high-level, since it initially continues to receive a low-level signal from the delay unit 210.

Meanwhile, during the delay period t1, the second NAND gate NAND2 of the internal power supply 220 receives the high-level output from the first NAND gate NAND1 at a first input, the high-level word line enable control signal PXi a second input, and the high-level internal command signal Pself at a third input, and thus outputs a low-level signal by performing a NAND operation. The low-level output signal is applied to the gate terminal of the third PMOS transistor P3. Accordingly, the third PMOS transistor P3 is turned on and the internal power supply voltage VINT is transferred to the boost node NO1. Also, when the corresponding word line enable bar signal NWEiB is activated to the low level at time T4, the second PMOS transistor P2 is turned on and the internal power supply voltage VINT is transferred to the enable node NO2, such that the corresponding word line WL is primarily boosted to the internal power supply level VINT.

As stated above, when the word line enable control signal PXi is activated to the high level and applied to the NOR gate, the NOR gate outputs a low-level signal by performing a NOR operation. The delay unit 210 receives the low-level signal and outputs a high-level delay signal, delaying for the time t1, as the internal power supply 220 transfers the internal power supply voltage VINT to the boost node NO1. After delaying for the time t1, the delay unit 210 outputs the high-level delay signal.

Accordingly, the first NAND gate NAND1 receives the high-level delay signal from the delay unit 210 and the high-level word line enable control signal PXi, and outputs a low-level signal by performing a NAND operation. The low-level signal is applied to the gate terminal of the first PMOS transistor P1 of the main word line driver, turning on the first PMOS transistor P. At the same time, the low-level signal is applied to the first input of the second NAND gate NAND2, which thus outputs a high-level signal by performing a NAND operation, turning off the third PMOS transistor P3. Accordingly, the boosted voltage VPP is transferred to the boost node NO1. Since the corresponding word line enable bar signal NWEiB is activated to the low level, the second PMOS transistor P2 is turned on and the boosted voltage VPP is transferred to the enable node NO2, such that the corresponding word line WL is secondarily enabled to the boosted voltage VPP.

Then, when other word lines are activated among the multiple row address signals, the corresponding word line enable bar signal NWEiB is deactivated to the high level at time T6, and the corresponding word line enable control signals PXi and PXiB are deactivated to the low level and the high level, respectively. The low-level word line enable control signal PXi is input to the first NAND gate NAND 1, which accordingly outputs a high level signal, effectively inverting the word line enable control signal PXi. The high level signal is applied to the gate terminal of the first PMOS transistor P1 of the main word line driver, turning off the first PMOS transistor P1. Simultaneously, the corresponding word line enable control signal PXiB at the high level is applied to the gate terminal of the second NMOS transistor N2 of the main word line driver, turning on the second NMOS transistor N2. Thus, the transfer of the boosted voltage VPP to the boost node NO1 is stopped and the ground voltage is transferred to the corresponding word line WL, such that the corresponding word line WL is disabled. This operation is the same as that of the normal operating mode.

In the semiconductor memory device as described above, only the boosted voltage VPP is supplied during the time interval T1~T3 of the normal operating mode. By contrast, during the time interval T4~T6 of the self-refresh operating mode, the internal power supply voltage VINT is initially supplied, and after a given time has elapsed, the internal power supply voltage VINT is interrupted and the boosted voltage VPP is subsequently supplied.

Assuming that the efficiency of the boosted voltage generator 410 is 33%, 20 mA are consumed to supply a boosted current of 10 mA in the semiconductor memory device, according to an exemplary embodiment of the present invention. Without supplying the internal power supply current of 30 mA, 5 mA are primarily supplied by the internal power supply current and the remaining 5 mA are secondarily supplied by the boosted voltage VPP.

Since the primary current of 5 mA to be supplied by the internal power supply directly uses the internal power supply voltage VINT, an efficiency of 100% is provided and no other current consumption takes place. Since the internal power supply current of 15 mA is required to supply the secondary boosted current of 5 mA in consideration of the efficiency of the boosted voltage generator 10, the total internal power supply current of 20 mA is needed. Thus, embodiments of the present invention can reduce current consumption by 10 mA in comparison with the conventional technique which has a total current consumption of 30 mA.

In this regard, since given delay time t1 is required while the internal power supply voltage VINT is primarily supplied, before the boosted voltage VPP is supplied, when implemented in the self-refresh operating mode, the embodiment additionally requires a slight delay time in order to enable a corresponding word line WL in comparison with the conventional technique. However, since the self-refresh operating mode typically operates for a long time period, this additional time is not problematic.

In a word line driver and a semiconductor memory device having the word line driver, according to an exemplary embodiment of the present invention, an internal power supply voltage and a boosted voltage are sequentially supplied during a self-refresh operation, thereby improving and/or maximizing efficiency of providing a boosted voltage of a main word line driver without an additional internal power supply current and reducing consumption of an internal power supply current. A word line driver and a semiconductor memory device having the word line driver, according to an exemplary embodiment of the present invention, can exhibit improved performance by maximizing efficiency in providing a boosted voltage of a main word line driver during a self-refresh operation and reducing consumption of an internal power supply current.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A word line driver for use in a semiconductor memory device, the word line driver comprising:
    a boosted voltage generator that generates a boosted voltage by receiving an internal power supply voltage and pumping electric charge;
    a sub word line driver that receives the internal power supply voltage, activates a boosted voltage control signal in a normal operating mode in response to a command signal, and activates the boosted voltage control signal after supplying the internal power supply voltage to a boost node in a command operating mode; and
    a main word line driver that enables a word line with the boosted voltage by supplying the boosted voltage to the boost node in response to the boosted voltage control signal in the normal operating mode, and enables the word line with the boosted voltage after boosting the word line to the internal power supply voltage by changing the boost node from the internal power supply voltage to the boosted voltage in the command operating mode.

2. The word line driver of claim 1, wherein the main word line driver comprises:
    a boosted voltage supply that receives and transfers the boosted voltage to the boost node in response to the boosted voltage control signal; and
    a word line enable unit that enables the word line with the boosted voltage by receiving the boosted voltage from the boosted voltage supply in the normal operating mode in response to the command signal, and that enables the word line with the boosted voltage by receiving the boosted voltage from the boosted voltage supply after initially boosting the word line to the internal power supply voltage by receiving the internal power supply voltage from the sub word line driver in the command operating mode.

3. The word line driver of claim 2, wherein the word line enable unit enables or disables the word line with the boosted voltage or with a ground voltage, respectively, in the normal operating mode in response to a word line enable bar signal and a second word line enable control signal, and
    enables or disables the word line with the boosted voltage, after boosting the word line to the internal power supply voltage, or with the ground voltage, respectively, in the command operating mode.

4. The word line driver of claim 3, wherein the boosted voltage supply comprises:
    a first p-type metal-oxide-semiconductor (PMOS) transistor that receives and transfers the boosted voltage to the boost node in response to the boosted voltage control signal.

5. The word line driver of claim 4, wherein the word line enable unit comprises:
    a second PMOS transistor that receives the boosted voltage from the first PMOS transistor at one side and transfers the boosted voltage to the word line connected to an enable node in response to the word line enable bar signal;
    a first n-type metal-oxide-semiconductor (NMOS) transistor that receives and transfers the ground voltage to the word line in response to the word line enable bar signal; and
    a second NMOS transistor that receives and transfers the ground voltage to the word line in response to the second word line enable control signal when other word lines are activated.

6. The word line driver of claim 5, wherein the sub word line driver comprises:
    an operating mode selector that outputs an operating mode selection signal for selecting the normal operating mode or the command operating mode according to a voltage of the command signal;
    an internal power supply that receives and transfers the internal power supply voltage before the boosted voltage is transferred in response to a first word line enable control signal and the command signal;
    a delay unit that receives the operating mode selection signal and outputs a delay signal for delaying the boosted voltage to be supplied by the boosted voltage supply until the internal power supply voltage is transferred; and
    a boosted voltage controller that outputs the boosted voltage control signal for controlling whether to transfer the boosted voltage by receiving the delay signal and the first word line enable control signal and performing a NAND operation thereon.

7. The word line driver of claim 6, wherein the operating mode selector comprises:
   a first inverter that receives and inverts the command signal and outputs the inverted command signal; and
   a NOR gate that outputs the operating mode selection signal by receiving the inverted command signal and the first word line enable control signal and performing a NOR operation thereon.

8. The word line driver of claim 7, wherein the internal power supply comprises:
   a second NAND gate that outputs an internal power supply voltage control signal for preventing the boosted voltage and the internal power supply voltage from being simultaneously supplied by receiving the boosted voltage control signal, the first word line enable control signal, and the command signal, and performing a NAND operation thereon;
   a second inverter that receives and inverts the first word line enable control signal and outputs the inverted word line enable control signal;
   a third PMOS transistor that receives and transfers the internal power supply voltage to the boost node in response to the internal power supply voltage control signal; and
   a third NMOS transistor that receives and transfers the ground voltage to the boost node in response to the inverted first word line enable control signal.

9. The word line driver of claim 8, wherein the delay unit comprises:
   an odd number of inverters that receive the operating mode selection signal and output the delay signal by inverting a level after a time delay until the internal power supply voltage is transferred.

10. The word line driver of claim 9, wherein the boosted voltage controller comprises:
    a first NAND gate that outputs the boosted voltage control signal by receiving the delay signal and the first word line enable control signal and performing a NAND operation thereon.

11. The word line driver of claim 10, wherein at least one of a data read, a data write, and an active operation are performed in the normal operating mode, and
    a self-refresh operation is performed in the command operating mode.

12. A semiconductor memory device comprising:
    a boosted voltage generator that generates a boosted voltage by receiving an internal power supply voltage and pumping electric charge;
    a command decoder that receives and decodes an external command and generates a command signal;
    a row decoder that generates at least one word line enable bar signal for activating corresponding word lines by receiving and decoding row address signals of predetermined bits;
    a row address predecoder that generates a plurality of decoded row address signals by receiving and decoding row address signals of other bits except the predetermined bits; and
    a word line driver that enables the word line by activating a boosted voltage control signal in a normal operating mode in response to the command signal, the word line enable bar signal, and one of the plurality of decoded row address signals and supplying the boosted voltage to a boost node, and that enables the word line with the boosted voltage after boosting the word line to an internal power supply voltage by activating the boosted voltage control signal after the internal power supply voltage is supplied to the boost node in a command operating mode.

13. The semiconductor memory device of claim 12, wherein the word line driver comprises:
    a sub word line driver that receives the internal power supply voltage, activates the boosted voltage control signal in the normal operating mode in response to the command signal, and activates the boosted voltage control signal after supplying the internal power supply voltage to the boost node in the command operating mode; and
    a main word line driver that enables the word line with the boosted voltage by supplying the boosted voltage to the boost node in response to the boosted voltage control signal in the normal operating mode, and that enables the word line with the boosted voltage after boosting the word line to the internal power supply voltage by changing the boost node from the internal power supply voltage to the boosted voltage in the command operating mode.

14. The semiconductor memory device of claim 13, wherein the main word line driver comprises:
    a boosted voltage supply that receives and transfers the boosted voltage to the boost node in response to the boosted voltage control signal; and
    a word line enable unit that enables the word line with the boosted voltage by receiving the boosted voltage from the boosted voltage supply in the normal operating mode in response to the command signal, and that enables the word line with the boosted voltage by receiving the boosted voltage from the boosted voltage supply after initially boosting the word line to the internal power supply voltage by receiving the internal power supply voltage from the sub word line driver in the command operating mode.

15. The semiconductor memory device of claim 14, wherein the boosted voltage supply comprises:
    a first PMOS transistor that receives and transfers the boosted voltage to the boost node in response to the boosted voltage control signal.

16. The semiconductor memory device of claim 15, wherein the word line enable unit comprises:
    a second PMOS transistor that receives the boosted voltage from the first PMOS transistor and transfers the boosted voltage to the word line connected to an enable node in response to the word line enable bar signal;
    a first NMOS transistor that receives and transfers the ground voltage to the word line in response to the word line enable bar signal; and
    a second NMOS transistor that receives and transfers the ground voltage to the word line in response to a second word line enable control signal when other word lines are activated.

17. The semiconductor memory device of claim 16, wherein the sub word line driver comprises:
    an operating mode selector that outputs an operating mode selection signal for selecting the normal operating mode or the command operating mode according to a voltage of the command signal;
    an internal power supply that receives and transfers the internal power supply voltage before the boosted voltage is transferred in response to a first word line enable control signal and the command signal;

a delay unit that receives the operating mode selection signal and outputs a delay signal for delaying the boosted voltage to be supplied by the boosted voltage supply until the internal power supply voltage is transferred; and a boosted voltage controller that outputs the boosted voltage control signal for controlling whether to transfer the boosted voltage by receiving the delay signal and the first word line enable control signal and performing a NAND operation thereon.

18. The semiconductor memory device of claim 17, wherein the internal power supply comprises:

a second NAND gate that outputs an internal power supply voltage control signal for preventing the boosted voltage and the internal power supply voltage from being simultaneously supplied by receiving the boosted voltage control signal, the first word line enable control signal, and the command signal, and performing a NAND operation thereon;

a second inverter that receives and inverts the first word line enable control signal and outputs the inverted first word line enable control signal;

a third PMOS transistor that receives and transfers the internal power supply voltage to the boost node in response to the internal power supply voltage control signal; and a third NMOS transistor that receives and transfers the ground voltage to the boost node in response to the inverted first word line enable control signal.

19. The semiconductor memory device of claim 18, wherein the boosted voltage controller comprises:

a first NAND gate that outputs the boosted voltage control signal by receiving the delay signal and the first word line enable control signal and performing a NAND operation thereon.

20. The semiconductor memory device of claim 19, wherein at least one of a data read, a data write, and an active operation are performed in the normal operating mode, and a self-refresh operation is performed in the command operating mode.

* * * * *